(12) United States Patent
Himmer et al.

(10) Patent No.: US 10,243,129 B2
(45) Date of Patent: Mar. 26, 2019

(54) THERMOELECTRIC MODULE

(71) Applicant: Mahle International GmbH, Stuttgart (DE)

(72) Inventors: Thomas Himmer, Reichenbach (DE); Christopher Laemmle, Stuttgart (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 15/569,758

(22) PCT Filed: Apr. 25, 2016

(86) PCT No.: PCT/EP2016/059128
§ 371 (c)(1),
(2) Date: Oct. 26, 2017

(87) PCT Pub. No.: WO2016/173965
PCT Pub. Date: Nov. 3, 2016

(65) Prior Publication Data
US 2018/0204994 A1 Jul. 19, 2018

(30) Foreign Application Priority Data

Apr. 27, 2015 (DE) .................... 10 2015 207 683

(51) Int. Cl.
*H01L 35/30* (2006.01)
*H01L 35/06* (2006.01)
(52) U.S. Cl.
CPC .............. *H01L 35/30* (2013.01); *H01L 35/06* (2013.01)
(58) Field of Classification Search
CPC ................................ H01L 35/30; H01L 35/06
(Continued)

(56) References Cited

U.S. PATENT DOCUMENTS 3,221,508 A 12/1965 Roes et al.
3,510,362 A 5/1970 Charland et al.
(Continued)

FOREIGN PATENT DOCUMENTS

DE 102011007395 A1 10/2012
EP 2070129 A2 6/2009
(Continued)

OTHER PUBLICATIONS

English abstract for DE-10 2011 007 395.
English abstract for JP-2007-266138.
English abstract for JP-2010-98035.

*Primary Examiner* — Jayne L Mershon
(74) *Attorney, Agent, or Firm* — Fishman Stewart PLLC

(57) ABSTRACT

A thermoelectric module may include a module housing surrounding a module interior. Thermoelectric elements and conductor bridges may be arranged in the module interior. A first side of the module housing may include a first side wall connected in a heat-conducting fashion to first conductor bridges. A second side of the module housing may include a second side wall connected in a heat-conducting fashion to second conductor bridges. The thermoelectric elements may extend between the first and second conductor bridges. A liquid metal layer and a first electrical insulation layer may be arranged between the first conductor bridges and the first side wall. At least one further liquid metal layer may be arranged between the first conductor bridges and the first electrical insulation layer. At least one other liquid metal layer may be arranged between the first electrical insulation layer and the first side wall.

20 Claims, 2 Drawing Sheets

(58) Field of Classification Search
USPC .......................................................... 136/230
See application file for complete search history.

(56) References Cited

U.S. PATENT DOCUMENTS

| | | | |
|---|---|---|---|
| 2008/0173342 A1* | 7/2008 | Bell | ................ F02G 1/043 |
| | | | 136/201 |
| 2009/0056996 A1 | 3/2009 | Kato et al. | |
| 2010/0170554 A1 | 7/2010 | Hiroyama | |

FOREIGN PATENT DOCUMENTS

| | | |
|---|---|---|
| EP | 2159854 A1 | 3/2010 |
| JP | 2007-266138 A | 10/2007 |
| JP | 2010-98035 A | 4/2010 |
| WO | WO-2008091293 A2 | 7/2008 |

* cited by examiner

THERMOELECTRIC MODULE

CROSS-REFERENCE TO RELATED APPLICATIONS

This application claims priority to PCT/EP2016/059128 filed Apr. 25, 2016, which also claims priority to DE 10 2015 219 737.9 filed on Oct. 12, 2015 and DE 10 2015 207 683.0 filed on Apr. 27, 2015, the contents of which are hereby incorporated by reference in their entirety.

TECHNICAL FIELD

The invention relates to a thermoelectric module having a module housing, which surrounds a module interior and having multiple thermoelectric elements arranged in the module interior.

A thermoelectric module has multiple thermoelectric elements in the form of positively and negatively doped thermoelectric semiconductor materials, which are interconnected electrically via multiple conductor bridges, in particular in series. The thermoelectric module has a first and a second side wall, which are respectively connected, electrically insulated and securely, to multiple conductor bridges in heat-conducting fashion. If there is now a temperature difference between the first side wall and the second side wall, the thermoelectric elements generate an electric voltage. Through the temperature difference, required for generating the electric voltage, between the first side wall and the second side wall, mechanical stresses occur in the thermoelectric module, which limit the maximum temperature and temperature differences.

BACKGROUND

The present invention is based on the problem of indicating an improved or at least different embodiment of a thermoelectric module, which in particular is distinguished by an expanded usable temperature range.

This problem is solved according to the invention by the subject of the independent claim. Advantageous further developments are the subject of the dependent subclaims.

SUMMARY

The invention is based on the general idea of producing the thermal contact between one of the two side walls and corresponding conductor bridges via a liquid metal layer. Such a layer is excellently heat-conducting and can serve, at the same time, as a type of lubricating film, so that no mechanical stresses occur owing to the different thermal expansion of the first side wall and of the second wall. It is expedient that the thermoelectric module has a liquid metal layer which is arranged between the first conductor bridges and the first side wall. Thereby, the first conductor bridges are only thermally contacted with the first side wall, whilst a relative movement of the first conductor bridges to the first side wall is possible. In this way, the different thermal expansions of the first side wall and of the second side wall, which lie at different temperature levels during operation, can be compensated. Thereby, higher temperature differences between the first side wall and the second side wall can be used, so that the efficiency and the power density of the thermoelectric module can be improved.

In the description and the enclosed claims, a liquid metal layer is understood to mean a layer which has a metal or a metal alloy, which is liquid at least at an operating temperature. The material of the liquid metal layer can therefore be solid at room temperature. Such metals or metal alloys preferably have a melting point between 50 and 250° C. Such alloys can contain for example gallium, bismuth, indium, copper, silver or tin. For example, an alloy of 32.5% bismuth, 16.5% tin and 51% indium is known as Field's metal and has a melting point of approximately 62° C. A further alloy is, for example, 58.0% bismuth, 42.0% tin and has a melting point at 138° C. Other such alloys are likewise possible.

In the description and the enclosed claims, an operating temperature is understood to mean the temperature during the operation of the thermoelectric module. As usually different temperatures are present at the first side and the second side of the thermoelectric module, a temperature gradient runs in the thermoelectric module. Consequently, the operating temperature is dependent on the position in the thermoelectric module. For example, the operating temperature of a liquid metal layer in the vicinity of one of the side walls which is heated during operation is higher than the temperature of a liquid metal layer in the vicinity of the other side, which is cooled during operation.

A favourable possibility makes provision that the first side of the thermoelectric module is a cold side and the second side of the thermoelectric module is a hot side. Thereby, the liquid metal layer lies on the colder side of the thermoelectric module. Therefore, a melting point of the material of the liquid metal layer should lie below 80° C.

A further favourable possibility makes provision that the first side of the thermoelectric module is a hot side and the second side of the thermoelectric module is a cold side. Thereby, the liquid metal layer lies on the hotter side of the thermoelectric module. Therefore, a melting point of the liquid metal layer should lie below 250° C., preferably below 150° C.

A particularly favourable possibility makes provision that the thermoelectric module has an electrical insulation layer, which is arranged between the first conductor bridges and the first side wall, and that at least one liquid metal layer is arranged between the first conductor bridges and the electrical insulation layer. In this way, the first conductor bridges and thereby the thermoelectric elements are mechanically decoupled from the electrical insulation layer. Thermally induced mechanical stresses in the thermoelectric elements can be reduced in this way.

A further particularly favourable possibility makes provision that the at least one liquid metal layer is arranged between the electrical insulation layer and the first side wall. In this way, the electrical insulation layer is mechanically decoupled from the first side wall. Thermally induced mechanical stresses can be thereby reduced.

An advantageous solution makes provision that the at least one liquid metal layer is electrically insulated to the conductor bridges. In this way, the risk of electrical short-circuits, which could be caused by the liquid metal layer, can be reduced.

A further advantageous solution makes provision that the electrically insulating layer is formed by a structured ceramic body and that the structured ceramic body has, on a side facing the conductor bridges, webs which separates from one another regions associated with the individual conductor bridges. The structuring of the ceramic body and thereby of the electrical insulation layer facilitates the mounting of the thermoelectric module and increases the stability of the thermoelectric module.

A particularly advantageous solution makes provision that the structured ceramic body has multiple metallized surfaces and that on the side facing the conductor bridges the metallized surfaces are interrupted by the webs. The metallized surfaces improve the contact between the ceramic body and metals. This can be advantageous for example during soldering. In addition, the contact of a liquid metal layer to the ceramic body is improved by the metallized surfaces.

In the description and the enclosed claims, a metallized surface is understood to mean a surface on which a metal layer is applied. This can take place for example by burning-in a metallization paste. Such metallization pastes can have for example copper, silver or tungsten. In addition, the burnt-in metallization paste can be coated with nickel and/or silver.

A further particularly advantageous solution makes provision that multiple liquid metal layers are arranged between the metallized surfaces and the conductor bridges. Preferably, a liquid metal layer is provided for each conductor bridge. Thus, the liquid metal layer can produce a thermal contact between the conductor bridges and the electrically insulating layer, wherein the conductor bridges are mechanically decoupled from the electrically insulating layer.

A favourable variant makes provision that a liquid metal layer is arranged between each pair of metallized surface and conductor bridge. Therefore, all conductor bridges can be tempered, so that an optimum heat transmission is made possible from the first conductor bridges to the first side wall.

A further favourable variant makes provision that the liquid metal layer is in contact respectively with at least one of the metallized surfaces. Thereby, the thermal contact to the insulating layer is also produced.

A particularly favourable variant makes provision that the structured ceramic body has a cohesive metallized surface on a side facing the first side wall. Thereby, a contact to a liquid metal layer can be improved, which runs between the electrical insulation layer and the first side wall. Therefore, a thermal contact can be improved between the first side wall and the electrical insulation layer.

A further particularly favourable variant makes provision that a liquid metal layer lies against the cohesive metallized surface. Thereby, the thermal is improved between the structured ceramic body, therefore the electrical insulation layer, and the liquid metal layer. Thereby, the thermal contact from the side wall to the electrical insulation layer is also improved, whereby also the thermal contact between the first side wall and the first conductor bridges is also improved.

An advantageous possibility makes provision that the electrical insulation layer is formed by multiple ceramic elements, and that the first conductor bridges are formed by metallized surfaces on the ceramic elements. In this way, on the one hand, the conductor bridges can be constructed so as to be very compact. On the other hand, a very good thermal contact occurs between the conductor bridges and the ceramic elements, so that overall the thermal contact from the conductor bridges to the first side wall is improved.

Preferably, the metallized surfaces, which form the conductor bridges, have a thickness of 150 □m to 300 □m. Such a thickness is sufficient in order to provide a sufficient electrical conductivity between the thermoelectric elements connected by the first conductor bridges.

A further advantageous possibility makes provision that the first side wall has multiple metallized surfaces, that a liquid metal layer lies respectively against the metallized surfaces of the first side wall, that the ceramic elements have metallized surfaces on the side facing away from the conductor bridges, and that the liquid metal layers lie respectively against a metallized surface of the ceramic elements. Thereby, the liquid metal layers lie respectively against a metallized surface of the first side wall and against a metallized surface of a ceramic element, so that the liquid metal layers produce a thermal connection between the ceramic elements and the first side wall. At the same time, the ceramic elements and the first side wall remain mechanically decoupled from one another, so that a thermal stress equalization is achieved.

A particularly advantageous possibility makes provision that the first side wall is constructed as so as be double-walled, and that the first side wall has an inner wall and an outer wall, and that a liquid metal layer is arranged between the inner wall and the outer wall.

In this way, the mechanical decoupling takes place between the inner wall and the outer wall. At the same time, the thermal conductivity between the inner wall to the outer wall is maintained, so that heat can still be directed from or to the first conductor bridges.

A favourable solution makes provision that the electrical insulation layer is applied on a side of the inner wall facing the conductor bridges. Thereby, the electrical insulation layer can be configured to be particularly thin, because it itself does not have to be mechanically load-bearing. Thereby, a good thermal contact can be retained via the electrical insulation layer.

A further favourable solution makes provision that the electrical insulation layer is formed by burning-in a dielectric onto the inner wall. This is a simple possibility to achieve a thin electrical insulation layer.

A particularly favourable solution makes provision that the electrical insulation layer is formed by thermal spraying of a ceramic onto the inner wall. In this way, a reliable thin ceramic layer can be formed. Thereby, a good electrical insulation can be achieved with, at the same time, good thermal heat conduction.

A further particularly favourable solution makes provision that the electrical insulation layer is formed by a ceramic body which is soldered onto the inner wall. This makes possible a robust connection between the electrical insulation layer and the inner wall.

An advantageous variant makes provision that the electrical insulation layer is applied onto the conductor bridges. Thereby, a particularly thin electrical insulation layer can be achieved, because this itself does not have to be load-bearing. Thereby, a sufficient electrical insulation and, at the same time, high thermal heat conductivity of the electrical insulation layer can be achieved.

Preferably, the conductor bridges are provided from five sides with the electrical insulation layer. Only the side on which the conductor bridges are connected to the thermoelectric elements, is not provided with the electrical insulation layer. For example, the electrical insulation layer can be applied onto the conductor bridges by an immersion bath, or can be sprayed by spraying devices onto the conductor bridges, or imprinted onto the conductor bridges.

A further advantageous variant makes provision that the first side wall has multiple metallized surfaces, that a liquid metal layer lies respectively on the metallized surfaces of the first side wall, that the conductor bridges have a metallized surface respectively on the electrical insulation layer, and that the liquid metal layers lie respectively against a metallized surface of the insulation layer. Thereby, a thermal contact can be achieved between the electrical insulation layer and the first side wall, so that a thermal contact is also produced between the first side wall and the first conductor bridges. At the same time, the first conductor bridges are mechanically decoupled from the first side wall, so that thermal stresses are reduced.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained further in the following description, wherein the same reference numbers refer to identical or similar or functionally identical components.

BRIEF DESCRIPTION OF THE DRAWINGS

There are shown, respectively diagrammatically.

DETAILED DESCRIPTION

Figure 1:
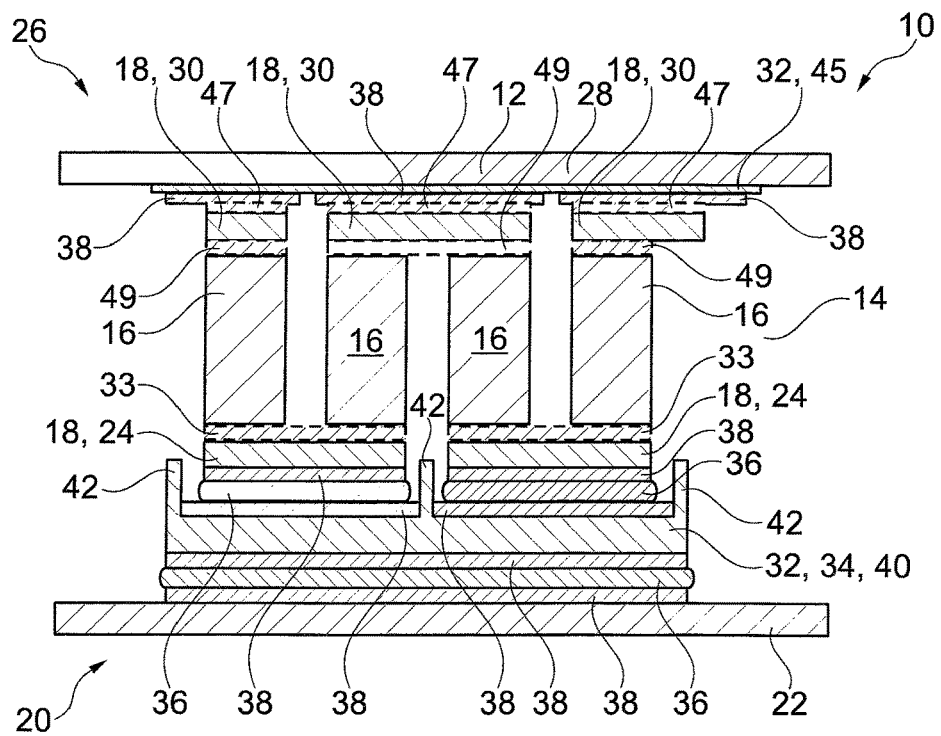
FIG. 1 a sectional illustration through a thermoelectric module according to a first embodiment.

A thermoelectric module 10 illustrated in FIG. 1 is used for the generating of electrical energy from thermal energy. For example, the thermoelectric module 10 can be used in the utilization of residual heat in the exhaust line of a motor vehicle. The thermoelectric module 10 has a module housing 12, which surrounds a module interior 14. In the module interior 14 multiple thermoelectric elements 16 are arranged, which are electrically connected by multiple conductor bridges 18. Preferably, the thermoelectric elements 16 are connected electrically in series by the conductor bridges 18. The module housing 12 has on a first side 20 a first side wall 22, which is connected in heat-conducting fashion to multiple first conductor bridges 24. In addition, the module housing 12 has on a second side 26 a second side wall 28, which is connected in heat-conducting fashion to multiple second conductor bridges 30, wherein the thermoelectric elements 16 extend between the first conductor bridges 24 and the second conductor bridges 30. Both on the first side 20 and on the second side 26, the conductor bridges 18 are connected respectively via an electrical insulation layer 32 to the respective side walls 22, 28. Thereby, the conductor bridges 18 are separated electrically from the side walls 22, 28.

The first conductor bridges 24 are connected in heat-conducting fashion to the thermoelectric elements 16. Such an electrically conducting connection 33 can be produced for example by soldering or silver sintering. With a soldered connection, a solder is preferably used which has a melting point of over 120° C., for example a silver-copper compound. The conductor bridges 18 preferably have copper, nickel or iron. To improve the connection, the conductor bridges 18 can have an adhesion base, for example titanium, silver, nickel or copper. Furthermore, the conductor bridges 18 can have a barrier layer, for example nickel.

A first electrical insulation layer 34 is arranged between the first conductor bridges 24 and the first side wall 22. The first conductor bridges 24 are respectively in contact via a liquid metal layer 36 with the first electrical insulation layer 34.

Preferably, the first conductor bridges 24 and the first electrical insulation layer 34 respectively have metallized surfaces 38. The metallized surfaces 38 improved the wetting with the liquid metal of the liquid metal layer 36. The metallized surfaces 38 can be produced for example by burning-in of a metallization paste. Such metallization pastes can have, for example, copper, silver or tungsten. The thickness of the metallization layer lies preferably between 20 □m and 300 □m. Preferably, the layers formed by the metallization pastes are additionally coated with nickel and/or silver.

The liquid metal layers 36 have a metal or a metal alloy which is liquid at an operating temperature of the thermoelectric module 10. As a temperature gradient is present in the thermoelectric module 10 during operation, the operating temperature is dependent on the position of the respective element in the thermoelectric module 10. When the liquid metal layer 36 lies for example on a heated first side 20 of the thermoelectric module 10, a higher melting point can be sufficient than if the liquid metal layer 36 were to lie on a cooled side of the thermoelectric module 10. Preferably, metals or metal alloys with a melting point between 50° C. and 250° C. are used. Such metal alloys are, for example, gallium, bismuth, indium, copper, silver and/or stannous alloys.

The first electrical insulation layer 34 is formed by a ceramic body 40, which has multiple webs 42. The webs 42 divide the ceramic body 40 into multiple regions which are respectively associated with a first conductor bridge 24. The first conductor bridges 24 are thermally connected to the regions associated with them via the liquid metal layers 36.

The webs 42 separate the metallized surfaces 38 on the ceramic body 40 from one another. Furthermore, the webs 42 separate the liquid metal layers 36 from one another, so that no electrical contact is present between the liquid metal layers 36.

Furthermore, the ceramic body 40 likewise has on a side facing the first side wall 22 a metallized surface 38, which improves the contact to a further liquid metal layer 36, which is arranged between the first electrical insulation layer 34 and the first side wall 22 and produces a thermal contact between these two.

To improve the wetting of the first side wall 22 with the liquid metal layer 36, the first side wall 22 can also be provided with a metallized surface 38.

Through this arrangement, the first conductor bridges and therefore the thermoelectric elements 16 are mechanically decoupled to the first electrical insulation layer 34, so that thermally induced mechanical stresses can be compensated. Furthermore, the first electrical insulation layer 34 is also mechanically decoupled from the first side wall 22, so that here also the thermally induced mechanical stresses can be reduced. Overall, such a structure permits a higher operating temperature of the thermoelectric module 10, whereby a considerably improved efficiency can be achieved.

On the second side 26 of the thermoelectric module 10, the second side wall 28 is provided with a second electrical insulation layer 45. This second electrical insulation layer 45 can be produced for example by burning-in a dielectric or by thermal spraying-on of a ceramic layer or by soldering-on a ceramic body. For example, $Al_2O_3$, AlN or $Si_3N_4$ ceramics can be used.

The second conductor bridges 30 are connected to the second electrical insulation layer 45. Such an electrically conducting connection 47 can preferably be a soldered connection. For example, a soft solder with a melting point above 120° C., such as tin for example, can be used. Likewise, a hard solder, for example a silver-copper alloy, or an active solder, for example a silver-copper-titanium alloy, is possible. Alternatively or additionally to this, the connection 47 between the second conductor bridges 30 and the second electrical insulation layer 45 can be produced by silver sintering.

In order to improve the wetting of the second electrical insulation layer 45, the latter can also be provided with a metallized surface 38.

The second conductor bridges 30 are electrically connected to the thermoelectric elements 16. Such a connection 49 could be, for example, a soldered connection. The solder used can be for example a soft solder with a melting point of above 120°, a hard solder, for example a silver-copper alloy. Alternatively or additionally to this, the second conductor bridges 30 can be connected to the thermoelectric elements 16 by means of a silver sintering.

In this described variant, the first side 20 of the thermoelectric module 10 is used as the hot side and the second side 26 of the thermoelectric module 10 is used as the cold side. Of course, a complementary use is also possible. Then, however, the soldered connections on the second side 26, which is then the hot side, should not be produced by means of a soft solder. Instead, the soldered connections on the first side 20, which is then the cold side, can also be formed by means of a soft solder.

Figure 2:
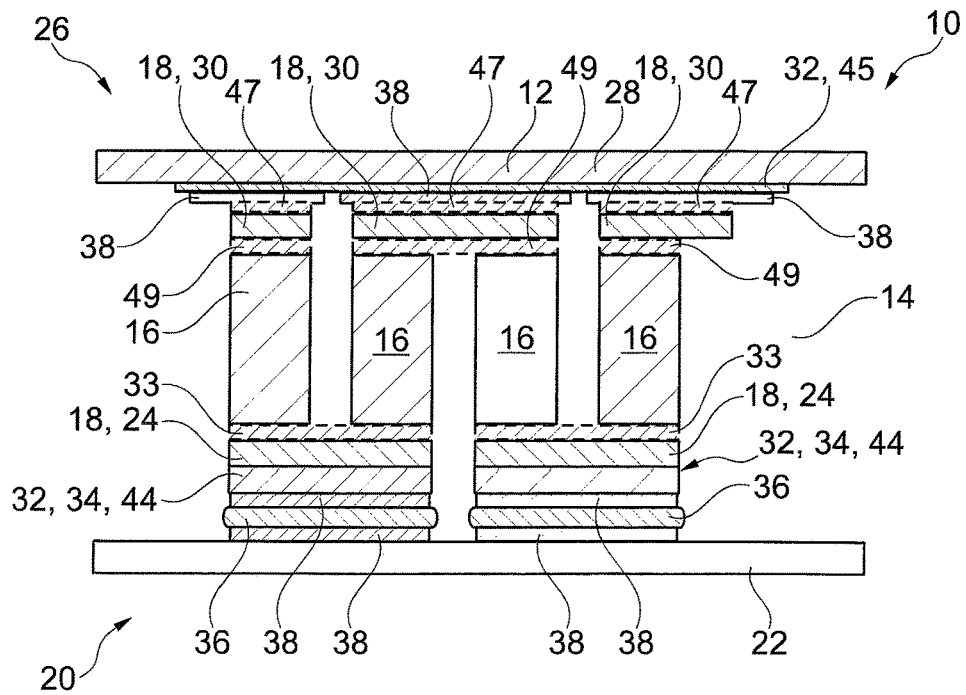
FIG. 2 a sectional illustration through a thermoelectric module according to a second embodiment.

A second embodiment of the thermoelectric module 10, illustrated in FIG. 2, differs from the first embodiment of the thermoelectric module 10, illustrated in FIG. 1, in that the first electrical insulation layer 34 is formed by multiple ceramic elements 44 and in that the first conductor bridges 24 are formed respectively by a metallized surface 38 on the ceramic elements 44 of the first electrical insulation layer 34.

Thereby, the ceramic elements 44 of the first electrical insulation layer 34 are mechanically connected securely to the thermoelectric elements 16 via the first conductor bridges 24. The metallic surfaces 38, which form the first conductor bridges 24, preferably have a thickness of 150 □m to 300 □m. Thereby, a sufficient conductivity can be achieved.

The ceramic elements 44 have in addition respectively a second metallized surface 38, which are arranged on the side lying opposite the first conductor bridges 24, therefore the side of the ceramic elements 44 facing the first side wall 22. These metallized surfaces 38 serve for the improved wetting of liquid metal layers 36, which are arranged between the first electrical insulation layer 34 and the first side wall 22. As the first electrical insulation layer 34 is formed by multiple ceramic elements 44, the metallized surfaces 38 are interrupted, whereby also the liquid metal layer 36 is interrupted and therefore each ceramic element 44 is connected thermally to the first side wall 22 by its own liquid metal layer 36.

Otherwise, the second embodiment of the thermoelectric module 10 illustrated in FIG. 2 conforms to the first embodiment of the thermoelectric module 10, illustrated in FIG. 1, with regard to structure and function, the above description of which is referred to in this respect.

Figure 3:
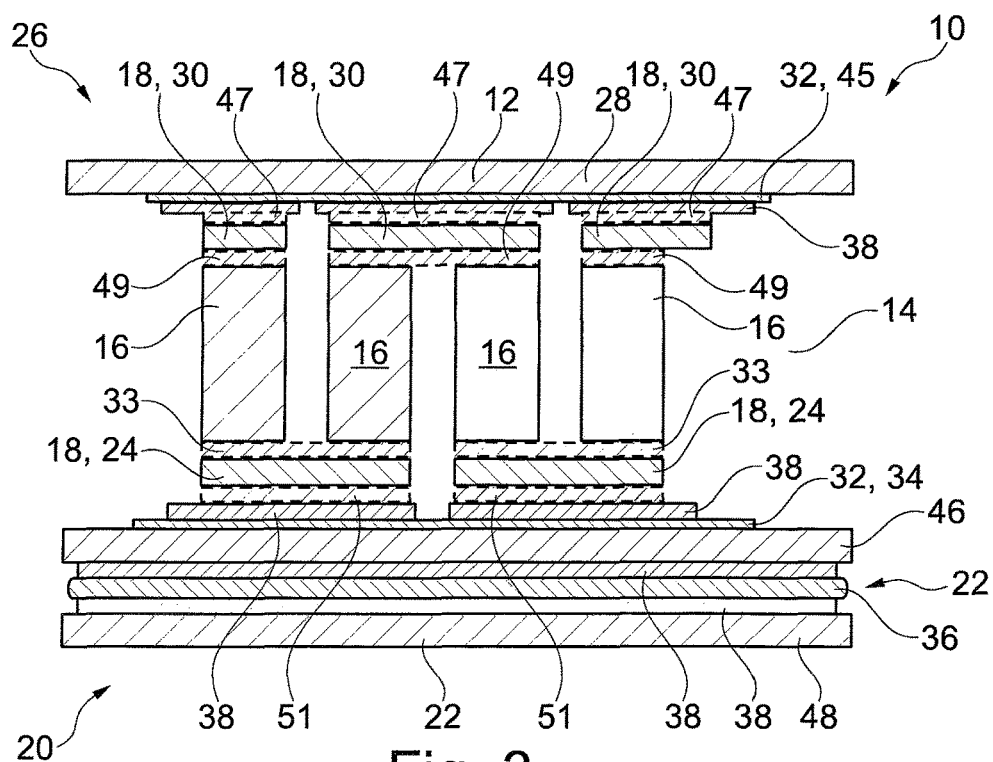
FIG. 3 a sectional illustration through a thermoelectric module according to a third embodiment.

A third embodiment of the thermoelectric module 10 illustrated in FIG. 3 differs from the first embodiment of the thermoelectric module 10 illustrated in FIG. 1 in that the first side wall 22 is configured so as to be double-walled and a liquid metal layer 36 runs between an inner wall 46 and an outer wall 48 of the first side wall 22. The inner wall 46 and the outer wall 48 can be provided respectively with a metallized surface 38, in order to improve the wetting with the liquid metal layer 36.

On a side facing the first conductor bridges 24, the inner wall 46 has the first electrical insulation layer 34. The first electrical insulation layer 34 can be formed for example by burning-in a dielectric. Alternatively or additionally to this, the first electrical insulation layer 34 can also be formed by thermal spraying of a ceramic onto the inner wall 46. In addition, the first electrical insulation layer 34 can also be formed by a ceramic body, which is soldered onto the inner wall 46.

The first conductor bridges 24 are connected to the first electrical insulation layer 34. Such a connection 51 can be, for example, a soldered connection with hard solder or active solder. Alternatively to this, the first conductor bridges 24 can also be connected to the first electrical insulation layer 34 by means of silver sintering.

In order to improve the wetting of the first electrical insulation layer 34, the latter can be provided with a metallized surface 38. Otherwise, the third embodiment of the thermoelectric module 10, illustrated in FIG. 3, conforms with regard to structure and function to the first embodiment of the thermoelectric module 10, the above description of which is referred to in this respect.

Figure 4:
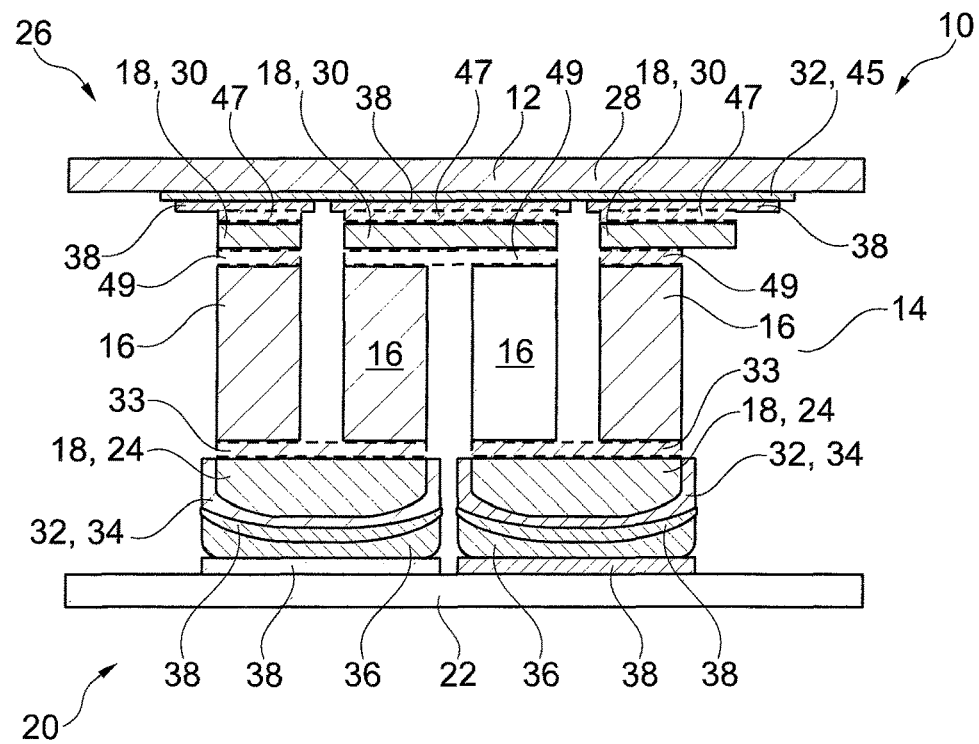
FIG. 4 a sectional illustration through a thermoelectric module according to a fourth embodiment.

A fourth embodiment of the thermoelectric module 10 illustrated in FIG. 4 differs from the first embodiment of the thermoelectric module 10 illustrated in FIG. 1 in that the first electrical insulation layer 34 is formed by a coating of the first conductor bridges 24. The first electrical insulation layer 34 is therefore divided into multiple layer sections, which respectively coat the first conductor bridges 24.

The first electrical insulation layer 34 is applied here from several sides onto the respective first conductor bridge 24. Only the side with which the first conductor bridges 24 are connected to the thermoelectric elements 16 is not covered by the first electrical insulation layer 34. The first electrical insulation layer 34 can be formed for example by a dielectric which is applied onto the conductor bridges by immersing, spraying or imprinting. The first conductor bridges 24 can be configured here so as to be cuboid-shaped or cuboid-shaped with rounded corners. Alternatively or additionally hereto, the first conductor bridges 24 can also be formed as a metal sheet shaped in a convex manner, wherein one side of the conductor bridges, which is connected to the thermoelectric elements 16, is flat.

A liquid metal layer 36 is arranged between the first electrical insulation layer 34 and the first side wall 22 and forms a thermal contact between the first side wall 22 and the first conductor bridges 24. For better wetting, both the first electrical insulation layer 34 and also the first side wall 22 can be provided with a metallized surface 38.

Otherwise, the embodiment of the thermoelectric module 10 illustrated in FIG. 4 conforms with regard to structure and function to the embodiment of the thermoelectric module 10 illustrated in FIG. 1, the above description of which is referred to in this respect.

The invention claimed is:

1. A thermoelectric module comprising:
   a module housing surrounding a module interior;
   a plurality of thermoelectric elements arranged in the module interior;
   a plurality of conductor bridges arranged in the module interior configured for an electrical interconnection of the thermoelectric elements;

wherein a first side of the module housing includes a first side wall connected in a heat-conducting fashion to a plurality of first conductor bridges;
wherein a second side of the module housing includes a second side wall connected in a heat-conducting fashion to a plurality of second conductor bridges;
wherein the plurality of thermoelectric elements extend between the plurality of first and the plurality of second conductor bridges;
a liquid metal layer arranged between the plurality of first conductor bridges and the first side wall;
a first electrical insulation layer arranged between the plurality of first conductor bridges and the first side wall;
at least one further liquid metal layer arranged between the plurality of first conductor bridges and the first electrical insulation layer;
at least one other liquid metal layer arranged between the first electrical insulation layer and the first side wall;
wherein the first electrical insulation layer is configured as a structured ceramic body;
wherein a side of the structured ceramic body facing the plurality of conductor bridges includes a plurality of webs separating the structured ceramic body into regions separate from one another that are respectively associated with an individual one of the plurality of first conductor bridges;
wherein the structured ceramic body includes a plurality of metallized surfaces; and
wherein on the side of the structured ceramic body facing the plurality of conductor bridges the plurality of metallized surfaces are interrupted by the plurality of webs.

2. The thermoelectric module according to claim 1, wherein
the first side is a cold side and the second side is a hot side, or
the first side is a hot side and the second side is a cold side.

3. The thermoelectric module according to claim 2, wherein the structured ceramic body has a cohesive metallized surface on a side facing the first side wall.

4. The thermoelectric module according to claim 1, wherein
the structured ceramic body has a cohesive metallized surface on a side facing the first side wall.

5. The thermoelectric module according to claim 1, wherein the first side of the module housing is the cold side and the second side of the module housing is the hot side.

6. The thermoelectric module according to claim 1, wherein the first side of the module housing is the hot side and the second side of the module housing is the cold side.

7. The thermoelectric module according to claim 1, wherein the plurality of metallized surfaces have a thickness of 150 µm-300 µm.

8. A thermoelectric module comprising:
a module housing surrounding a module interior, the module housing having at least a first side and a second side;
a plurality of thermoelectric elements arranged in the module interior;
a plurality of conductor bridges arranged in the module interior and configured for an electrical interconnection of the plurality of thermoelectric elements;
the first side of the module housing including a first side wall connected in a heat-conducting fashion to a plurality of first conductor bridges;
the second side of the module housing including a second side wall connected in a heat-conducting fashion to a plurality of second conductor bridges;
the plurality of thermoelectric elements extending between the plurality of first conductor bridges and the plurality of second conductor bridges;
a liquid metal layer arranged between the plurality of first conductor bridges and the first side wall;
a first electrical insulation layer arranged between the plurality of first conductor bridges and the first side wall;
at least one further liquid metal layer arranged between at least one of the plurality of first conductor bridges and the first electrical insulation layer, and between the first electrical insulation layer and the first side wall;
wherein the first electrical insulation layer comprises a plurality of ceramic elements; and
wherein the plurality of first conductor bridges comprise a plurality of metallized surfaces on the plurality of ceramic elements.

9. The thermoelectric module according to claim 8, wherein
the first side wall includes a plurality of metallized surfaces;
a plurality of liquid metal layers lie respectively against the plurality of metallized surfaces of the first side wall;
the plurality of metallized surfaces of the plurality of ceramic elements are disposed on a side facing away from the plurality of conductor bridges; and
the plurality of liquid metal layers lie respectively against a respective one of the plurality of metallized surfaces of the plurality of ceramic elements.

10. The thermoelectric module according to claim 8, wherein the at least one further liquid metal layer is arranged between the plurality of first conductor bridges and the first electrical insulation layer.

11. The thermoelectric module according to claim 8, wherein the at least one further liquid metal layer is arranged between the first electrical insulation layer and the first side wall.

12. A thermoelectric module, comprising:
a module housing surrounding a module interior, the module housing having a first side and a second side;
a plurality of thermoelectric elements arranged in the module interior;
a plurality of conductor bridges arranged in the module interior configured for an electrical interconnection of the plurality of thermoelectric elements;
the first side of the module housing including a first side wall connected in a heat-conducting fashion to a plurality of first conductor bridges;
the second side of the module housing including a second side wall connected in a heat-conducting fashion to a plurality of second conductor bridges;
the plurality of thermoelectric elements extending between the plurality of first conductor bridges and the plurality of second conductor bridges;
a liquid metal layer arranged between the plurality of first conductor bridges and the first side wall;
a first electrical insulation layer arranged between a first conductor bridge and the first side wall;
at least one further liquid metal layer is arranged between at least one of the plurality of first conductor bridges and the first electrical insulation layer, and between the first electrical insulation layer and the first side wall;
wherein the first side wall is configured to be double-walled;

the first side wall including an inner wall and an outer wall; and at least one other liquid metal layer arranged between the inner wall and the outer wall.

13. The thermoelectric module according to claim 12, wherein
the first electrical insulation layer is disposed on a side of the inner wall facing the plurality of conductor bridges.

14. The thermoelectric module according to claim 12, wherein the at least one further liquid metal layer is arranged between the plurality of first conductor bridges and the first electrical insulation layer.

15. The thermoelectric module according to claim 12, wherein the at least one further liquid metal layer is arranged between the first electrical insulation layer and the first side wall.

16. The thermoelectric module according to claim 12, wherein at least one of the first electrical insulation layer and the second electrical insulation layer comprises a dielectric burned onto the inner wall.

17. The thermoelectric module according to claim 12, wherein at least one of the first electrical insulation layer and the second electrical insulation layer comprises a ceramic sprayed onto the inner wall.

18. A thermoelectric module, comprising:
a module housing surrounding a module interior, the module housing having at least a first side and a second side;
a plurality of thermoelectric elements arranged in the module interior;
a plurality of conductor bridges arranged in the module interior configured for an electrical interconnection of the plurality of thermoelectric elements;
the first side of the module housing including a first side wall connected in a heat-conducting fashion to a plurality of first conductor bridges;
the second side of the module housing including a second side wall connected in a heat-conducting fashion to a plurality of second conductor bridges;
the plurality of thermoelectric elements extending between the plurality of first conductor bridges and the plurality of second conductor bridges;
a liquid metal layer arranged between the plurality of first conductor bridges and the first side wall;
a first electrical insulation layer arranged between the plurality of first conductor bridges and the first side wall;
at least one further liquid metal layer arranged between at least one of the plurality of first conductor bridges and the first electrical insulation layer, and between the first electrical insulation layer and the first side wall;
wherein the first electrical insulation layer is disposed onto the plurality of conductor bridges;
the first side wall including a plurality of metallized surfaces;
at least one other liquid metal layer lying respectively against the plurality of metallized surfaces of the first side wall;
wherein the plurality of conductor bridges include a metallized surface respectively on the first electrical insulation layer; and
wherein the plurality of liquid metal layers lie respectively against a metallized surface of the first electrical insulation layer.

19. The thermoelectric module according to claim 18, wherein the at least one further liquid metal layer is arranged between the plurality of first conductor bridges and the first electrical insulation layer.

20. The thermoelectric module according to claim 18, wherein the at least one further liquid metal layer is arranged between the first electrical insulation layer and the first side wall.

* * * * *